United States Patent
Kohlstedt

(10) Patent No.: US 6,664,785 B2
(45) Date of Patent: Dec. 16, 2003

(54) ASSEMBLY FOR MEASURING A MAGNETIC FIELD, USING A BRIDGE CIRCUIT OF SPIN TUNNEL ELEMENTS AND A PRODUCTION METHOD FOR THE SAME

(75) Inventor: Hermann Kohlstedt, Kerpen (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/220,662

(22) PCT Filed: Feb. 7, 2001

(86) PCT No.: PCT/EP01/01305
§ 371 (c)(1),
(2), (4) Date: Aug. 30, 2002

(87) PCT Pub. No.: WO01/65269
PCT Pub. Date: Sep. 7, 2001

(65) Prior Publication Data
US 2003/0020471 A1 Jan. 30, 2003

(30) Foreign Application Priority Data
Mar. 2, 2000 (DE) .......................... 100 09 944

(51) Int. Cl.$^7$ ............................................. G01R 33/06
(52) U.S. Cl. ................. 324/252; 324/207.21; 313/314; 438/3
(58) Field of Search ........................ 324/207.21, 252; 338/32 R; 360/313, 314, 316, 319, 324, 324.1, 324.11, 324.12, 324.2; 438/3, 48, 14

(56) References Cited

U.S. PATENT DOCUMENTS

| | | | |
|---|---|---|---|
| 5,561,368 A | 10/1996 | Dovek et al. | |
| 2002/0024780 A1 | * 2/2002 | Mao et al. | 360/324.11 |

FOREIGN PATENT DOCUMENTS

| | | |
|---|---|---|
| EP | 0 953 849 | 11/1999 |
| WO | WO 98/14793 | 4/1998 |
| WO | WO 00/10023 | 2/2000 |

* cited by examiner

Primary Examiner—Jay Patidar
(74) Attorney, Agent, or Firm—Herbert Dubno

(57) ABSTRACT

The invention relates to an assembly for measuring a magnetic field, comprising at least a first layer assembly (8) and at least a second layer assembly (10), whereby the first layer assembly (8) and the second layer assembly (10) have a hard magnetic layer (16), a layer (18) which acts as a tunnel barrier and lies adjacent to the hard magnetic layer and a soft magnetic layer (20) which lies adjacent to the layer (18) which acts as a tunnel barrier. The layer assemblies (8, 10) are located in a bridge circuit for determining the electric resistance. The invention is characterized in that the second layer assembly (10) also has an electrically conductive anti-ferromagnetic layer (22) lying adjacent to the soft magnetic layer (20), or an electrically conductive artificial anti-ferromagnet lying adjacent to said soft magnetic layer (20). The invention also relates to a method for producing the inventive assembly.

16 Claims, 1 Drawing Sheet

ASSEMBLY FOR MEASURING A MAGNETIC FIELD, USING A BRIDGE CIRCUIT OF SPIN TUNNEL ELEMENTS AND A PRODUCTION METHOD FOR THE SAME

The invention relates to an arrangement for measuring a magnetic field with at least one first layer assembly and at least a second layer assembly whereby the first layer assembly and the second layer assembly have a hard magnetic layer, a layer which is effective as a tunnel barrier adjacent the hard magnetic layer and a soft magnetic layer adjacent the layer which is effective as the tunnel barrier, and whereby the layer assemblies are arranged in a bridge circuit for determining the electrical resistance. The invention further relates to a method of making an arrangement for measuring a magnetic field in which the at least one first layer assembly and at least one second layer assembly are produced, whereby the first layer assembly and the second layer assembly have a hard magnetic layer, a layer effective as a tunnel barrier adjacent the hard magnetic layer and a soft magnetic layer adjacent the layer effective as the tunnel barrier.

An arrangement of the kind described and a process of the kind described are known. In the publication INFO PHYS TECH No. 24, October 1999, BMBF, VDI Technology Center Physical Technologies there is described how such arrangements can be used for measuring magnetic fields. A preferred field of use is for example the detection and the measurement of movements which are generally of great significance in automobile technology and in automation technology. Conventionally for such position sensing, Hall sensors are used (generally ABS sensors in automobiles). A new sensor concept utilizes the so-called travelling magneto resistance effect (GMR-Effect "Giant Magnetoresistance"). This effect is based upon the phenomenon that electrons because of their quantized spin states are strongly dispersed differently upon passage through magnetic layers each in dependence upon the magnetic orientation of these layers. With parallel magnetization, the dispersion is less than with magnetization which is arranged antiparallel. This gives rise to a change in the electrical resistance as a function of the external magnetic field in which the layer arrangement finds itself. The significance for a position sensor is that the outer magnetic field can be influenced by a movable element (generally a rotor or also a linearly-movable element) whereby these influences can be indicated as the electrical resistance in the layer arrangement.

Basically the layer construction is so chosen that one magnetic layer is configured as a measuring layer and another magnetic layer as a reference layer. With this arrangement, which is based upon the GMR effect, the intervening layer between these magnetic layers is a metal layer. If one replaces the metallic intermediate layer in the layer structure by a thin electrically-insulating layer, like for example $Al_2O_3$, one can obtain a magnetic tunnel component in which the tunnel current is switched in a manner similar to the current in the metallic GMR element. The advantage of the TMR element resides in a still higher signal level and in an extremely low requirement for an active component area.

There are high requirements for the measurement of the resistance of the layer arrangement since the resistance is the decisive parameter for the conclusion as to the magnitude and/or the direction of the magnetic field to be measured. It is known that resistances can be measured especially precisely with a Wheatstone bridge circuit. This is mainly based in temperature compensation requirements. Additionally with a Wheatstone bridge there is an output voltage which is symmetrical with respect to a zero point. In the construction of a Wheatstone bridge, the quality of the measurement is dependent upon the precision of the resistances used. Fixed resistances are determinable with practically optional precision. If one however utilizes a plurality of layer arrangements in the bridge circuit, their electrical resistances must be determined with precision or established with precision.

The invention has as its object, therefore, to provide an arrangement for measuring a magnetic field and a manufacturing process such that the electrical characteristics of the elements participating in the measurement can be known precisely or established with precision. These objects are achieved with the features of claims 1 and 12.

The invention builds upon the arrangement described at the outset in that the second layer assembly has, in addition, an electrically-conducting antiferromagnetic layer adjacent the soft magnetic layer or an electrically-conductive synthetic antiferromagnet adjacent the soft magnetic layer. In this manner, the second layer assembly, which is used as a resistor in the Wheatstone bridge circuit, can be designed like the first layer assembly. By means of the additional electrically-conductive antiferromagnetic layer, the second layer assembly is rendered magnetically insensitive. Such a "pinning" with the second layer assembly has significant advantages by comparison to a magnetic shielding. The last, which also can be used to reduce the magnitude sensitivity, requires the deposition of thicker high $\mu$ layers in the micrometer range. This has significant disadvantages in the production of the components. Preferably the bridge circuit is a Wheatstone bridge circuit.

In an embodiment of the invention, the four resistances of the Wheatstone bridge circuit are configured as first or second layer assemblies with at least one of the layer assemblies configured with the second layer assembly. With such a "full bridge", a greater stroke of the measurement signal can be generated.

In another embodiment, one resistance of the Wheatstone bridge is configured as a first layer assembly, one resistance of the Wheatstone bridge is configured as a second layer assembly and two resistances of the Wheatstone bridge are configured as fixed resistors. Since the two fixed resistors do not contribute to the bridge output signal of the "half bridge" the attainable stroke of the bridge is reduced, although with a precision selection of the fixed resistance, there can be a better reduction of the offset (signal voltage without applied field conditioned on resistance fluctuations over the wafer) of the bridge. While this can be realized in conjunction with tunnel contacts not without problems, it is conceivable for the hard magnetic layer of the layer arrangement to be an electrically-nonconductive antiferromagnetic layer. In this manner a reference magnetization can be supplied which is only limitedly influenced by the controlling outer magnetic field.

It can be advantageous to pin the hard magnetic layer of the layer assembly with an electrically-nonconductive antiferromagnetic layer. The hard magnetic layer can be selected in such manner that the best characteristics with respect to the tunnel contact are obtainable while it contains because of the pinning with the antiferromagnet, a sufficient counterfield stability and thus can be affected only in a magnetic manner.

It can be advantageous for the electrically-nonconductive antiferromagnetic layer to be comprised of $NiO_x$. $NiO_x$ is suitable as a nonconductor since in tunnel contacts, the current flow runs perpendicular to the substrate.

In another embodiment, the electrically-nonconductive antiferromagnetic layer is comprised of a synthetic antiferromagnet. Synthetic antiferromagnets (AAF) have good counterfield stability especially at high operating temperatures.

It is preferable for the synthetic antiferromagnet to have a layer system of Cu and Co or Ru. By the appropriate choice of the Cu layer thickness the antiparallel locations of the Co layers and Ru layers are achieved which can only be removed at very high magnetic fields. If one selects the thickness of the Co or Ru layers additionally such that the resulting magnetization is small, then the preferred magnetization direction of the synthetic antiferromagnet can only be changed with difficulty in an external magnetic field.

Preferably the electrically conductive antiferromagnetic layer is comprised of IrMn. In this manner it can act simultaneously to provide the requisite electrical conductivity function and also has the antiferromagnetic serving for pinning action. Preferably the tunnel barrier is comprised of $Al_2O_3$. Advantageously, the layer is so made that a thin Al layer is sputtered onto the hard magnetic layer. The sputtered Al layer is then reacted with an oxygen atmosphere of about 10 m bar for about 30 minutes, whereby a mercury low-pressure lamp is used to generate UV radiation and has the effect of converting the molecular oxygen into high reactive atomic oxygen and ozone. The oxidation is so carried out that as much as possible all of the deposited Al is completely oxidized. A plasma oxidation of the Al is also possible.

The invention includes a process in which the layer arrangements are formed parallel to one another in a single procedure and on the second layer arrangement additionally, an electrically-conductive antimagnetic layer is provided adjacent the soft magnetic layer or an electrically-conductive synthetic antiferromagnet is provided on and adjacent the soft magnetic layer. Through this process it is achieved that both the first and the second layer arrangements have the same resistance and electrical characteristics. This has been found to be especially suitable for use in a Wheatstone bridge circuit.

Preferably the layer arrangements are produced by deposition of the layers. This is an approved method of producing such components.

It is especially preferably when the additional electrically-conductive antiferromagnetic layer is applied in conjunction with the tunnel contact layer system. The fabrication process of the layer arrangement can thus be effected without interruption.

Then the finished layer assemblies, preferably are connected in a bridge circuit.

The invention is based upon the surprising discovery that the measurement of magnetic fields through the additional application of electrically-conductive antiferromagnetic layer on the magnetic layer in conjunction with a bridge circuit gives especially precise results. The basis for this, among other things, is that identical layer assemblies with identical electrical characteristics can be used both as reference elements and as magnetic field sensitivity elements. This has a special advantage also from the point of view of the process since the additional conductive antiferromagnetic layer of different layer assemblies can be produced in the same fabrication process.

The invention is described with reference to the accompanying drawing for exemplary embodiments.

Figure 1:
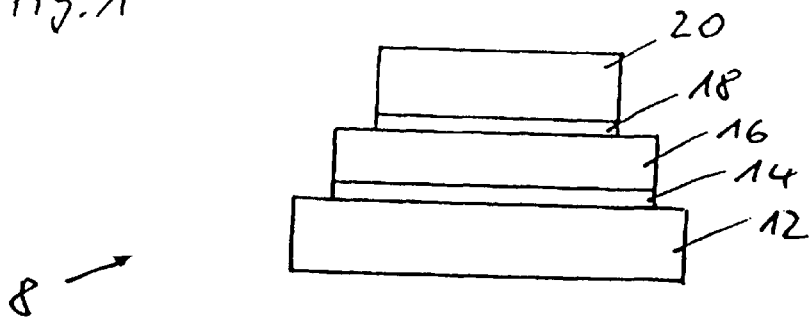
FIG. 1 shows a first layer assembly for an arrangement in accordance with the invention.

In FIG. 1 a first layer assembly 8 is shown for an arrangement in accordance with the invention. On a substrate 12, a nonconducting or conducting antiferromagnetic layer 14 is disposed, for example, a synthetic antiferromagnet. This layer 14 can be formed for example by $NiO_x$ or IrMn. On this layer is found a hard magnetic layer 16. This is followed by a tunnel barrier layer 18, for example of $Al_2O_3$. On the layer 18, effective as a tunnel barrier, there is finally a soft magnetic layer 20.

Figure 2:
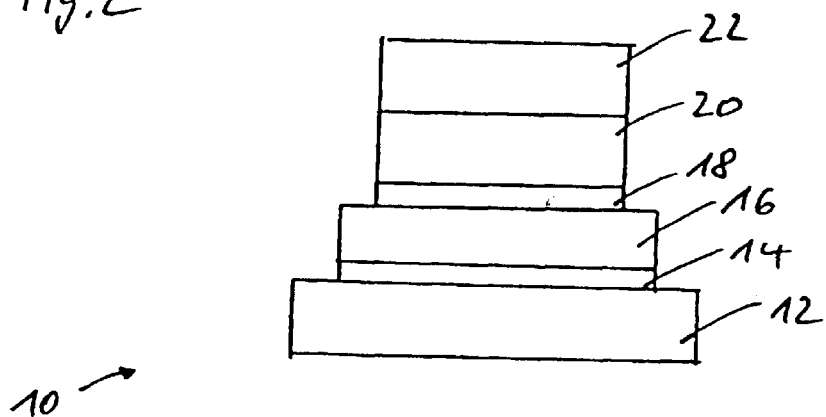
FIG. 2 shows a second layer assembly for an arrangement according to the invention.

In FIG. 2, a second layer assembly 10 is provided for use in the arrangement of the invention and the layer sequence is identical except that in the second layer arrangement 10, there is additionally on the soft magnetic layer 20 an electrically-conductive antiferromagnetic layer 22, for example of IrMn. Even including the soft magnetic layer 20, the layer assemblies 8 and 10 of FIGS. 1 and 2 can be fabricated in a common process. This has fabrication advantages; further, the layer assemblies 8, 10 are identical up to the layer 20, especially in terms of their electrical characteristics.

Figure 3:
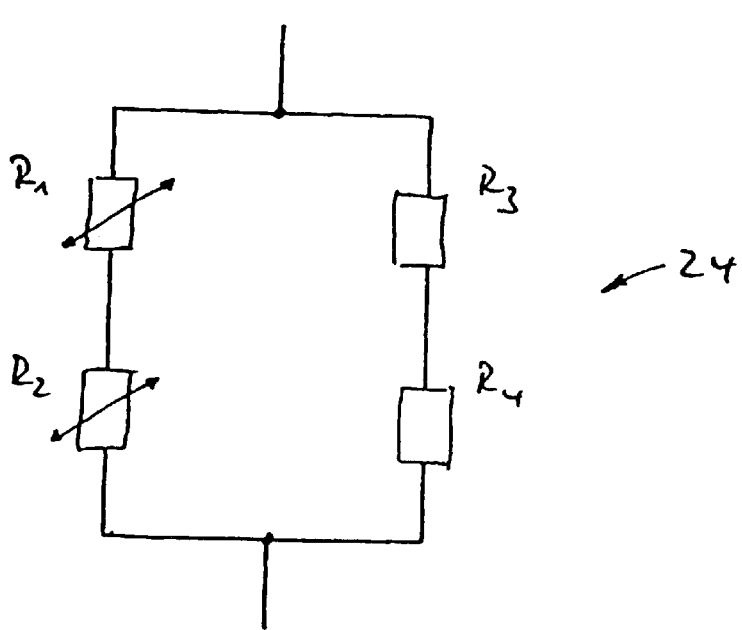
FIG. 3 shows the arrangements according to the invention.

In FIG. 3 the Wheatstone bridge 24 is shown for measuring the magnetic field dependency resistance. In the present case, it is a "half bridge", that means that the resistances R3 and R4 are fixed resistances while the resistances R1 and R2 are layer assemblies. If one selects, for example, for the resistance R1 the layer arrangement 8 according to FIG. 1 and the layer arrangement 10 for the resistance R2 according to FIG. 2, which have been produced in the same fabrication process, precise resistance measurements of those precise magnetic field measurements can be effected.

In the present description, in the drawing as well as in the claims, the features of the invention can be taken individually and also in optional combination and are important to the inventor's concept.

What is claimed is:

1. An arrangement for measuring a magnetic field with
   at least one first layer assembly (8) and
   at least one second layer assembly (10),
   whereby the first layer assembly (8) and the second layer assembly (10) have a hard magnetic layer (16), a layer (18) effective as a tunnel barrier and adjacent the hard magnetic layer, and a layer (18) effective as a tunnel barrier layer adjacent the soft magnetic layer (20) and
   whereby the layer assemblies (8, 10) are arranged in a bridge circuit (24) for determining the electrical resistance,
   characterized in
   that the second layer assembly (10) additionally has an electrically conductive antiferromagnetic layer (22), adjacent the soft magnetic layer (20) or an electrically-conductive synthetic antiferromagnet is adjacent the soft magnetic layer (20).

2. The arrangement according to claim 1,
   characterized in,
   that the bridge circuit (24) is a Wheatstone bridge circuit.

3. The arrangement according to claim 2,
   characterized in,
   that each of the four resistances of the Wheatstone bridge circuit (24) is configured with a first layer assembly (8) or second layer assembly (10) whereby at least one of the layer assemblies is configured as the second layer assembly (10).

4. The arrangement according to claim 2,
characterized in,
that one resistance ($R_1$) of the Wheatstone bridge is configured as the first layer assembly (8),
a resistance ($R_2$) of the Wheatstone bridge circuit (24) is configured as the second layer assembly (10) and
that two resistances ($R_3$ and $R_4$) of the Wheatstone bridge circuit 24 are configured as fixed resistors.

5. The arrangement according to claim 1,
characterized in,
that the hard magnetic layer (16) of the layer assemblies (8, 10) is an electrically nonconductive antiferromagnetic layer (14).

6. The arrangement according to 1,
characterized in,
that the hard magnetic layer (16) of the layer assemblies (8, 10) is penned with an electrically nonconductive antiferromagnetic layer (14).

7. The arrangement according to claim 6,
characterized in,
that the electrically nonconducting antiferromagnetic layer (14) is comprised of $NiO_x$.

8. The arrangement according to claim 6,
characterized in,
that the electrically nonconducting antiferromagnetic layer (14) is comprised of a synthetic antiferromagnet.

9. The arrangement according to claim 8,
characterized in,
that synthetic antiferromagnet has a layer system of Cu and Co.

10. The arrangement according to claim 1,
characterized in,
that the electrically conducting antiferromagnetic layer (22) is comprised of IrMn.

11. The arrangement according to claim 1,
characterized in,
that the layer effective as a tunnel barrier (18) is comprised of $Al_2O_3$.

12. A method of producing an arrangement for measuring a magnetic field in which
at least one first layer assembly (8)
at least one second layer assembly (10) are produced,
whereby the first layer assembly and the second layer assembly have a first hard magnetic layer (16), a layer (18) effective as a tunnel barrier and adjacent the hard magnetic layer (16) and a soft magnetic layer (20) adjacent the layer (18) effective as the tunnel barrier,
characterized in
that the layer assemblies (8, 10) are produced in parallel in a single process and
that on the second layer assembly (10) an additional electrically conducting antiferromagnetic layer is provided on the soft magnetic layer (20) or an electrically-conducting antiferromagnet is provided on the soft magnetic layer (20).

13. The method according to claim 12,
characterized in
that the layer assemblies (8, 10) are produced by deposition of layers.

14. The method according to claim 13,
characterized in
that the additional electrically-conducting antiferromagnetic layer (22) is applied in conjunction with the deposition.

15. The method according to claim 13,
characterized in
that the applied layer assemblies (8, 10) are connected in a bridge circuit (24).

16. The method according to claim 12,
characterized in
that the layer assemblies (8, 10) before finishing are connected in the bridge circuit (24) and
that on them as necessary the electrically-conducting antiferromagnetic layer (22) is applied to the desired elements of the bridge circuit (24).

* * * * *